(12) United States Patent
Chao

(10) Patent No.: US 10,270,244 B2
(45) Date of Patent: Apr. 23, 2019

(54) ELECTROSTATIC DISCHARGE PROTECTION CIRCUIT

(71) Applicant: RICHWAVE TECHNOLOGY CORP., Taipei (TW)

(72) Inventor: Chuan-Chen Chao, Taipei (TW)

(73) Assignee: RichWave Technology Corp., Taipei (TW)

( * ) Notice: Subject to any disclaimer, the term of this patent is extended or adjusted under 35 U.S.C. 154(b) by 351 days.

(21) Appl. No.: 15/059,251

(22) Filed: Mar. 2, 2016

(65) Prior Publication Data

US 2016/0285262 A1 Sep. 29, 2016

(30) Foreign Application Priority Data

Mar. 26, 2015 (TW) .............................. 104109696 A

(51) Int. Cl.
| | | |
|---|---|---|
| H02H 9/04 | (2006.01) | |
| H01L 29/861 | (2006.01) | |
| H01L 49/02 | (2006.01) | |
| H01L 27/02 | (2006.01) | |
| H01L 29/06 | (2006.01) | |
| H01L 27/06 | (2006.01) | |
| H01L 29/737 | (2006.01) | |

(52) U.S. Cl.
CPC ......... *H02H 9/046* (2013.01); *H01L 27/0259* (2013.01); *H01L 28/20* (2013.01); *H01L 29/0649* (2013.01); *H01L 29/861* (2013.01); *H01L 27/0647* (2013.01); *H01L 29/7371* (2013.01)

(58) Field of Classification Search
USPC .......................... 361/56, 111; 257/355–360
See application file for complete search history.

(56) References Cited

U.S. PATENT DOCUMENTS

| | | | |
|---|---|---|---|
| 8,981,426 B2 | 3/2015 | Chen | |
| 9,343,413 B2 | 5/2016 | Shan et al. | |
| 2001/0043449 A1 | 11/2001 | Okushima | |
| 2007/0262343 A1* | 11/2007 | Kuramoto | H01L 27/0255 257/107 |
| 2009/0213506 A1* | 8/2009 | Zhan | H01L 27/0262 361/56 |
| 2012/0145984 A1* | 6/2012 | Rabkin | H01L 29/6609 257/2 |

(Continued)

FOREIGN PATENT DOCUMENTS

| | | |
|---|---|---|
| CN | 103022030 A | 4/2013 |
| CN | 103427408 A | 12/2013 |

(Continued)

OTHER PUBLICATIONS

Chinese language office action dated Feb. 12, 2018, issued in application No. CN 201510134572.3.

*Primary Examiner* — Danny Nguyen
(74) *Attorney, Agent, or Firm* — Winston Hsu

(57) ABSTRACT

An ESD protection circuit includes an input port, a resistor, a BJT, and a diode. The BJT has an emitter, a base, and a collector. The emitter of the BJT is coupled to the input port. The base of the BJT is coupled through the resistor to the input port. The diode has a first terminal and a second terminal. The first terminal of the diode is the collector of the BJT. The second terminal of the diode is coupled to a supply voltage.

13 Claims, 8 Drawing Sheets

(56) References Cited

U.S. PATENT DOCUMENTS

2014/0111892 A1* 4/2014 Chen .................. H01L 27/0262
361/56

FOREIGN PATENT DOCUMENTS

| KR | 100876549 B1 | 12/2008 |
|----|--------------|---------|
| TW | M439893 | 10/2012 |
| TW | 201320292 | 5/2013 |
| TW | 201349450 | 12/2013 |
| TW | 201409655 | 3/2014 |

* cited by examiner

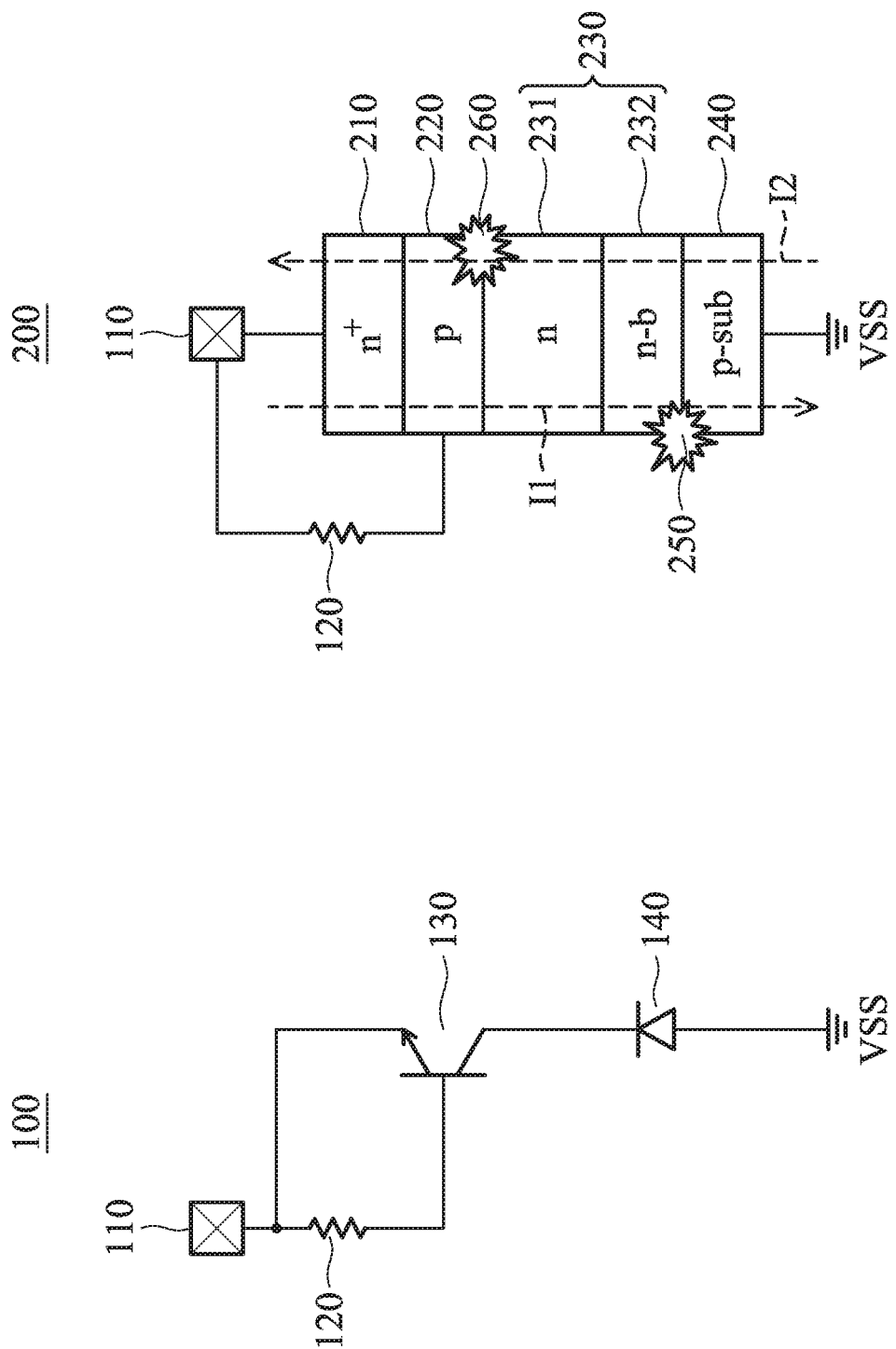

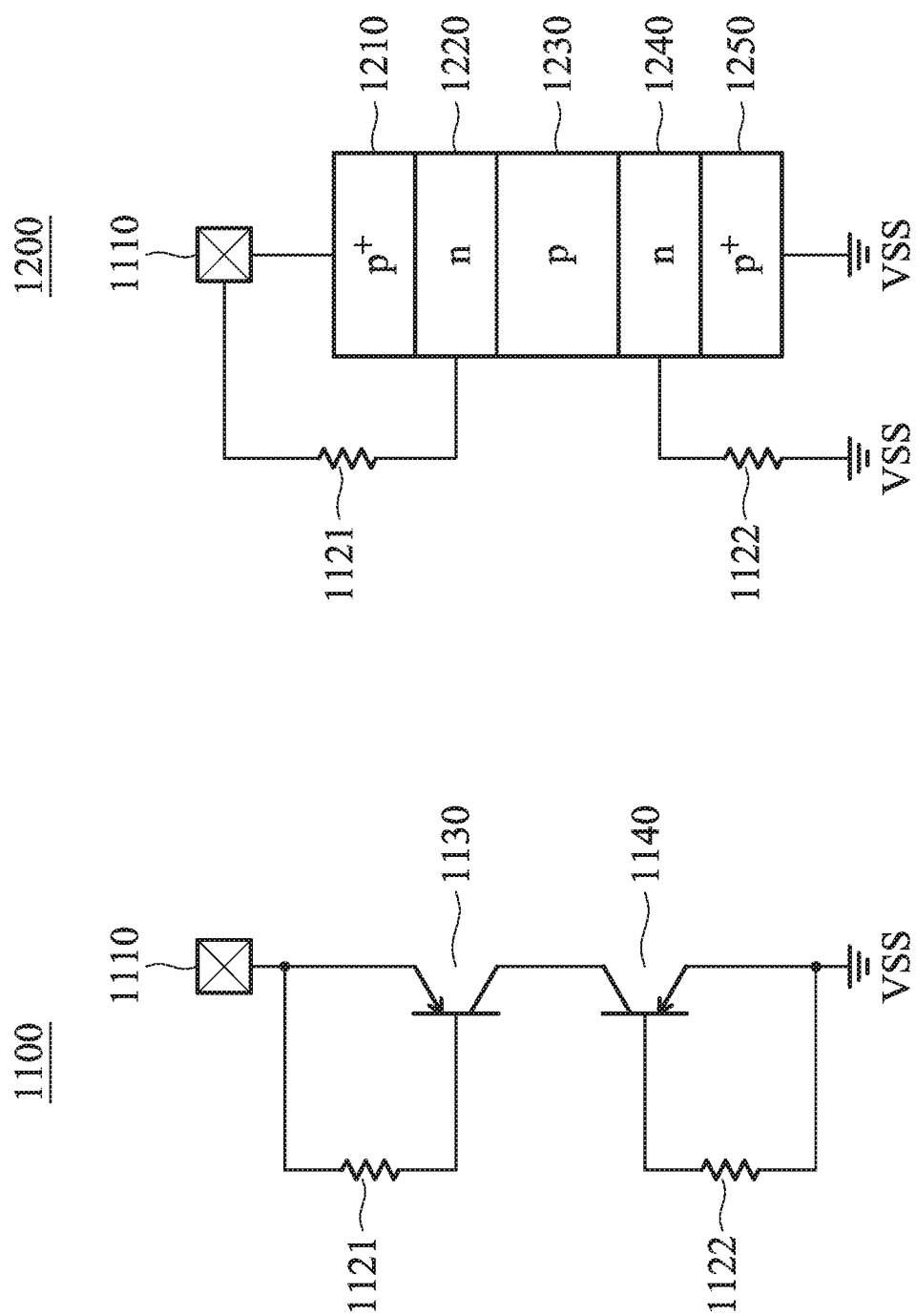

US 10,270,244 B2

ELECTROSTATIC DISCHARGE PROTECTION CIRCUIT

CROSS REFERENCE TO RELATED APPLICATIONS

This Application claims priority of Taiwan Patent Application No. 104109696, filed on Mar. 26, 2015, the entirety of which is incorporated by reference herein.

BACKGROUND OF THE INVENTION

Field of the Invention

The disclosure generally relates to ESD (ElectroStatic Discharge) protection circuits, and more specifically, to ESD protection circuits with low parasitic capacitances and high trigger voltages.

Description of the Related Art

In order to avoid ESD events to generate large currents and make circuit systems damaging, ESD protection circuits are widely used in a variety of integrated circuits (ICs). Specifically, high-power RF (Radio Frequency) power amplifiers require ESD protection circuits having low parasitic capacitances and high trigger voltages. However, most ESD protection circuits with sufficient ESD immunity have relatively large parasitic capacitances, which increase capacitive loading and worsen high-frequency frequency response of circuit systems. For example, the transfer function pole of a circuit moves toward a lower frequency, and therefore the operation bandwidth of the circuit becomes narrower. Thus, to design new ESD protection circuits is needed to solve the problems of large parasitic capacitance and low trigger voltage of traditional ESD protection circuit designs.

BRIEF SUMMARY OF THE INVENTION

In a preferred embodiment, the invention is directed to an ESD protection circuit including an input port, a resistor, a BJT (Bipolar Junction Transistor), and a diode. The BJT has an emitter, a base, and a collector. The emitter of the BJT is coupled to the input port. The base of the BJT is coupled through the resistor to the input port. The diode has a first terminal and a second terminal. The first terminal of the diode is the collector of the BJT. The second terminal of the diode is coupled to a supply voltage.

In another preferred embodiment, the invention is directed to an ESD protection circuit including an input port, a first resistor, a second resistor, a first BJT and a second BJT. The first BJT has an emitter, a base, and a collector. The emitter of the first BJT is coupled to the input port. The base of the first BJT is coupled through the first resistor to the input port. The second BJT has an emitter, a base, and a collector. The emitter of the second BJT is coupled to a supply voltage. The base of the second BJT is coupled through the second resistor to the supply voltage. The collector of the second BJT is the collector of the first BJT.

BRIEF DESCRIPTION OF DRAWINGS

The invention can be more fully understood by reading the subsequent detailed description and examples with references made to the accompanying drawings, wherein:

FIG. 1 is a diagram of an ESD protection circuit according to an embodiment of the invention;

FIG. 2 is a diagram of semiconductor layers of an ESD protection circuit according to an embodiment of the invention;

FIG. 11 is a diagram of an ESD protection circuit according to an embodiment of the invention; and FIG. 12 is a diagram of semiconductor layers of an ESD protection circuit according to an embodiment of the invention.

DETAILED DESCRIPTION OF THE INVENTION

Figure 3:
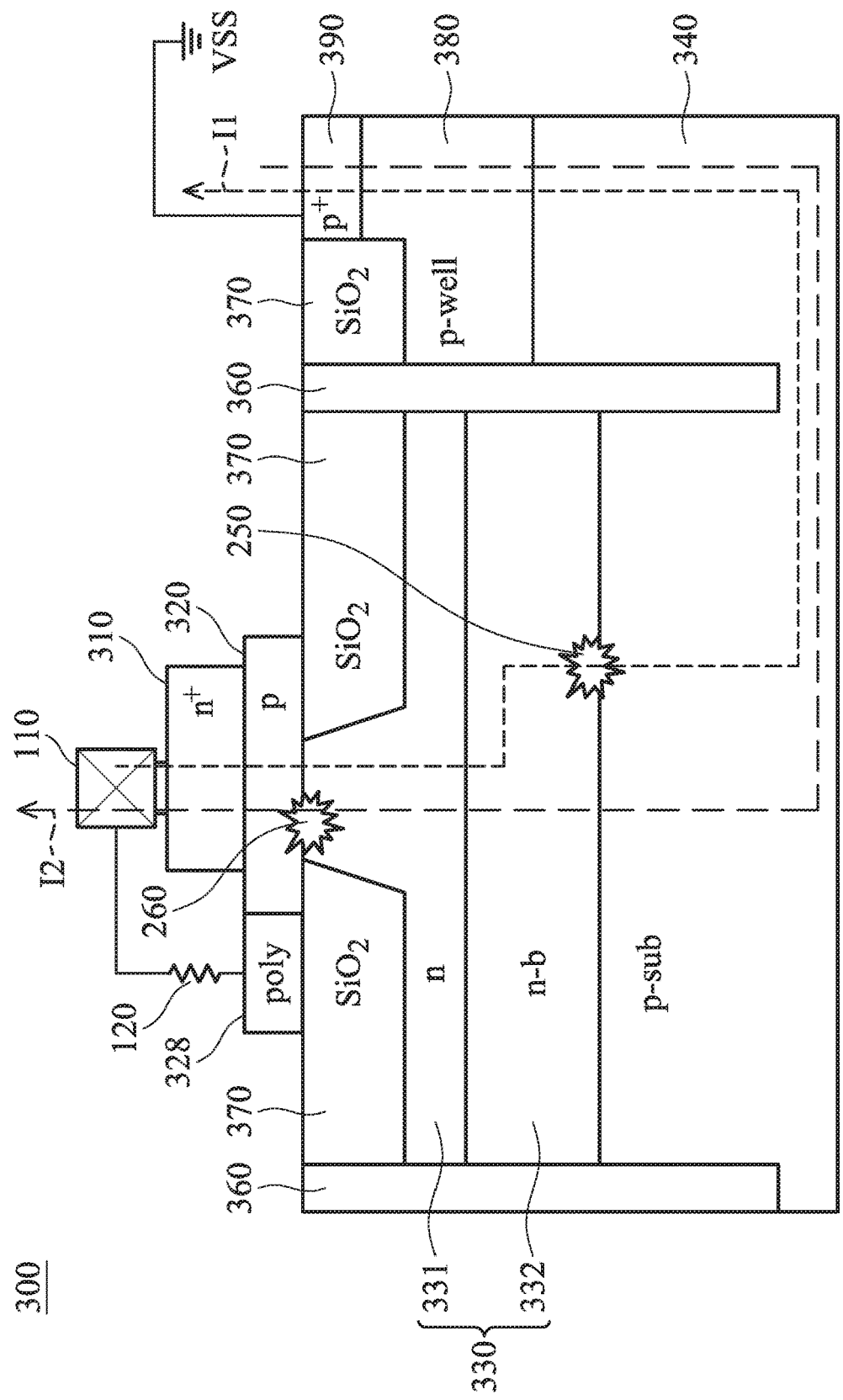
FIG. 3 is a diagram of a sectional semiconductor structure of an ESD protection circuit according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a diagram of an ESD protection circuit 100 according to an embodiment of the invention. ESD protection circuit 100 may be applied to an integrated circuit (IC), such as a high-power amplifier, an RF amplifier, a high-voltage power IC, or a high-power RF power amplifier. As shown in FIG. 1, ESD protection circuit 100 includes an input port 110, a resistor 120, a BJT 130, and a diode 140. Input port 110 may be a metal pad, which may be coupled to any terminal on a chip, such as a terminal of any circuit which needs ESD protection. Resistor 120 may be a two-port element (e.g., a poly-silicon resistor or a diffusion resistor) or a multi-port element (e.g., a voltage-controlled resistor). The resistance of Resistor 120 is from about 100Ω to about tens of kΩ (or, 100Ω). BJT 130 may be NPN-type. BJT 130 has an emitter, a base, and a collector. The emitter of BJT 130 is coupled to input port 110. The base of BJT 130 is coupled through resistor 120 to input port 110. Diode 140 has a first terminal (e.g., a cathode) and a second terminal (e.g., an anode), wherein the first terminal of diode 140 is also the collector of BJT 130 and the second terminal of diode 140 is coupled to a supply voltage (e.g., a ground voltage VSS or a power supply voltage VCC).

FIG. 2 is a diagram of semiconductor layers of an ESD protection circuit 200 according to an embodiment of the invention. FIG. 2 is used to describe the operation theory of ESD protection circuit 100 of FIG. 1. Please refer to FIG. 1 and FIG. 2 together. The emitter of BJT 130 is formed by a first type-I semiconductor 210. The base of BJT 130 is formed by a first type-II semiconductor 220. The collector of BJT 130 is formed by a second type-I semiconductor 230. Diode 140 is formed by semiconductor 230 and a second type-II semiconductor 240. In the embodiment of FIG. 2, semiconductor 210 is a high-doped N-type semiconductor, semiconductor 220 is a P-type semiconductor, semiconductor 230 is a low-doped N-type semiconductor, and semiconductor 240 is a P-type semiconductor substrate. In some embodiments, the dopant concentration of semiconductor 220 is much greater than that of semiconductor 240. Specifically, semiconductor 230 includes a collector layer 231 and a collector buried layer 232. Collector buried layer 232 is positioned between collector layer 231 and semiconductor 240. The dopant concentration of collector buried layer 232 is greater than that of collector layer 231.

The operation theory of ESD protection circuit 200 is as follows. When a positive voltage (the positive voltage is higher than a first trigger voltage VH1 of ESD protection circuit 200) is applied to input port 110, resistor 120, having a relatively small flowing current, can clamp the junction voltage between semiconductors 210 and 220, thereby preventing a PN-junction breakdown between semiconductors 220 and 210. At the meantime, the PN-junction between semiconductors 220 and 230 has a forward bias, and most of voltage-drop of the positive voltage is across the junction between semiconductors 230 and 240, such that diode 140 has a reverse bias (diode 140 is formed by semiconductors 230 and 240). When the reverse bias is too large, a PN-junction breakdown occurs (as a breakdown symbol 250). After the PN-junction breakdown occurs between semiconductors 240 and 230, BJT 130 (BJT 130 is formed by semiconductors 210, 220, and 230) operates in a reverse active mode, and therefore an input port current I1 flows from input port 110 through semiconductors 210, 220, 230, and 240 to the supply voltage (e.g., the ground voltage VSS). In such a case, the positive electrostatic charges on input port 110 can be removed fast by input port current I1. On the other hand, when a negative voltage (the negative voltage is lower than a second trigger voltage VH2 of ESD protection circuit 200) is applied to input port 110, a PN-junction breakdown occurs between semiconductors 220 and 230 (as a breakdown symbol 260). The breakdown current causes BJT 130 to operate in an active mode. The PN-junction between semiconductors 240 and 230 has a forward bias, and therefore an input port current I2 flows from the supply voltage (e.g., the ground voltage VSS) through semiconductors 240, 230, 220, and 210 to input port 110. In such a case, the negative electrostatic charges on input port 110 can be removed fast by input port current I2. The normal voltage operation region of input port 110 of the IC is within the first trigger voltage VH1 and the second trigger voltage VH2, when ESD protection circuits 100 and 200 are not triggered. ESD protection circuits 100 and 200 can be enabled if the voltage at input port 110 is too high or too low, thereby removing redundant charges on input port 110 and preventing the IC from being damaged. The first trigger voltage VH1 is determined by the PN-junction breakdown voltage between semiconductors 240 and 230. The second trigger voltage VH2 is determined by the PN-junction breakdown voltage between semiconductors 220 and 230. The lower dopant concentration of semiconductors results in a higher breakdown voltage and a wider normal voltage operation region of the IC. In the embodiment, the current gain of BJT 130 operating in active mode is greater than 100, and the current gain of BJT 130 operating in reverse active mode is greater than 1.

In an embodiment, among semiconductors 210, 220, 230, and 240, semiconductor 240 has the smallest dopant concentration. In the embodiment, the positive breakdown voltage of ESD protection circuit 200 is larger than its negative breakdown voltage. ESD protection circuit 200 provides an asymmetric operation voltage range, especially for the output terminal of a high-power RF power amplifier.

FIG. 3 is a diagram of a sectional semiconductor structure of an ESD protection circuit 300 according to an embodiment of the invention. As shown in FIG. 3, ESD protection circuit 300 includes an input port 110, a resistor 120, a first type-I semiconductor 310 (i.e. the emitter of BJT 130), a first type-II semiconductor 320 (i.e., the base of BJT 130), a second type-I semiconductor 330 (i.e., the collector of BJT 130, and also the cathode of diode 140), and a second type-II semiconductor 340 (i.e., the anode of diode 140). In an embodiment, BJT 130 of ESD protection circuit 100 could be an HBT (Heterojunction Bipolar Transistor), where semiconductor 320 is a SiGe layer and resistor 120 is further coupled through a poly-silicon layer 328 to semiconductor 320. Such a embodiment has higher current gain. The difference from the embodiment of FIG. 2 is that ESD protection circuit 300 further includes deep trenches 360, silicon dioxide (SiO2) islands 370, a type-II semiconductor well 380 (e.g., a P-type well), and a high-doped type-II semiconductor 390 (e.g., a high-doped P-type semiconductor). Silicon dioxide islands 370 are embedded in collector layer 331 of semiconductor 330, but it does not reach collector buried layer 332 of semiconductor 330. Semiconductor 390 is embedded in well 380, and is coupled to a supply voltage (e.g., a ground voltage VSS or a power supply voltage VCC). Accordingly, semiconductor 340 (i.e., the anode of diode 140) is connected by an ohmic contact to the supply voltage. Deep trench 360 isolates semiconductor 330 from well 380. When an aforementioned positive voltage or negative voltage is applied to input port 110, ESD protection circuit 300 can remove redundant charges as follows. When a PN-junction breakdown occurs between semiconductors 330 and 340 due to the aforementioned positive voltage applied to input port 110 (as breakdown symbol 250), input port current I1 flows from input port 110 through semiconductors 310, 320, 330, 340, well 380, and semiconductor 390 to the supply voltage. On the other hand, when an PN-junction breakdown occurs between semiconductors 320 and 330 due to the aforementioned negative voltage applied to input port 110 (as breakdown symbol 260), input port current I2 flows from the supply voltage through semiconductor 390, well 380, and semiconductors 340, 330, 320, 310 to input port 110.

Figures 4A, 4B:
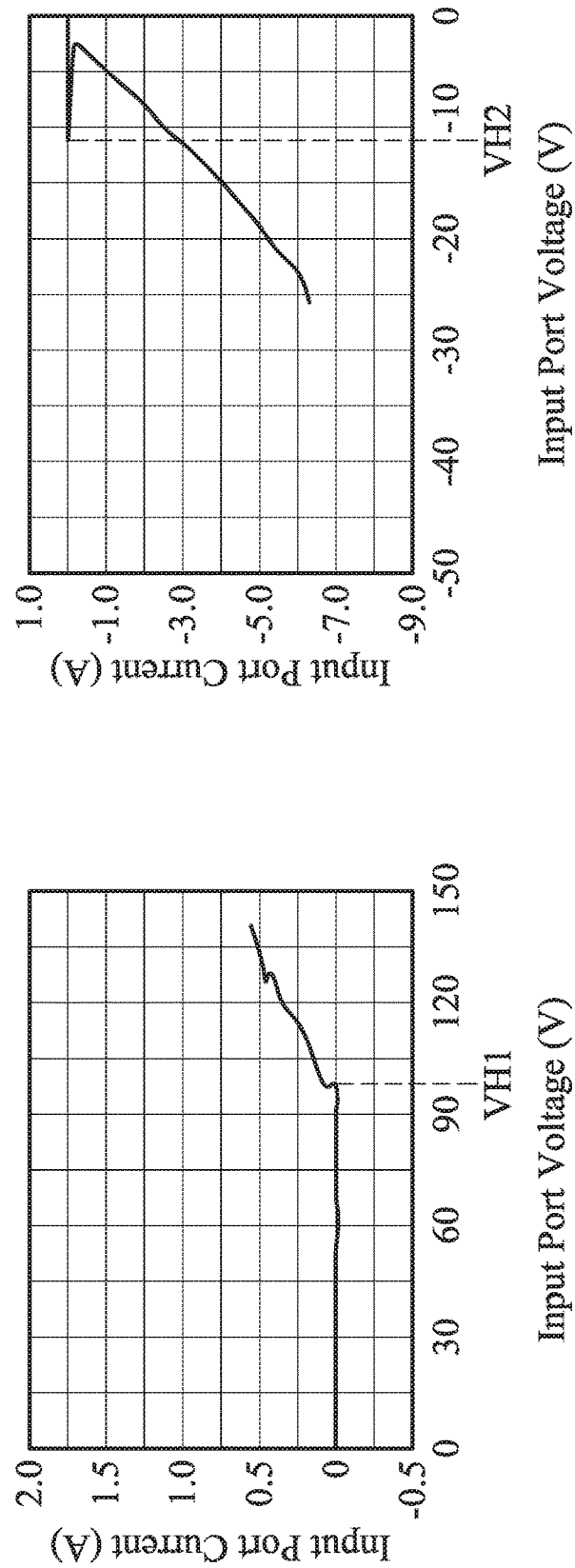
FIGS. 4A and 4B are diagrams of the relationship between input port voltage and input port current of an ESD protection circuit according to an embodiment of the invention.

FIG. 4A and FIG. 4B are diagrams of the relationship between the input port voltage and the input port current of ESD protection circuit 300, measured by a TLP (Transmission Line Pulse) generation system, according to an embodiment of the invention. FIG. 4A and FIG. 4B are used to describe the measurement results of ESD protection circuit 300 when positive voltages and negative voltages are applied to input port 110, respectively. As shown in FIG. 4A, if the input port voltage is higher than the first trigger voltage VH1, the magnitude of the input port current will be sharply increased. Here, VH1 is the positive breakdown voltage of ESD protection circuit 300, and it is about +98V. As shown in FIG. 4B, if the input port voltage is lower than the second trigger voltage VH2, the magnitude of the input port current will be sharply increased. Here, BJT 130 enters the active mode, so a snapback effect appears obviously. Such an effect reduces the voltage-drop at input port 110 and prevents the IC damage. In FIG. 4B, VH2 is the negative breakdown voltage of ESD protection circuit 300, and it is about −12V.

According to the sectional structure of FIG. 3, it is understood that in the invention, the contact area between the emitter and the base of BJT 130 of ESD protection circuit 300 is relatively small. The small contact area results a smaller equivalent capacitance, that means, a smaller parasitic capacitance, and therefore the IC has larger operation frequency bandwidth.

Figure 5:
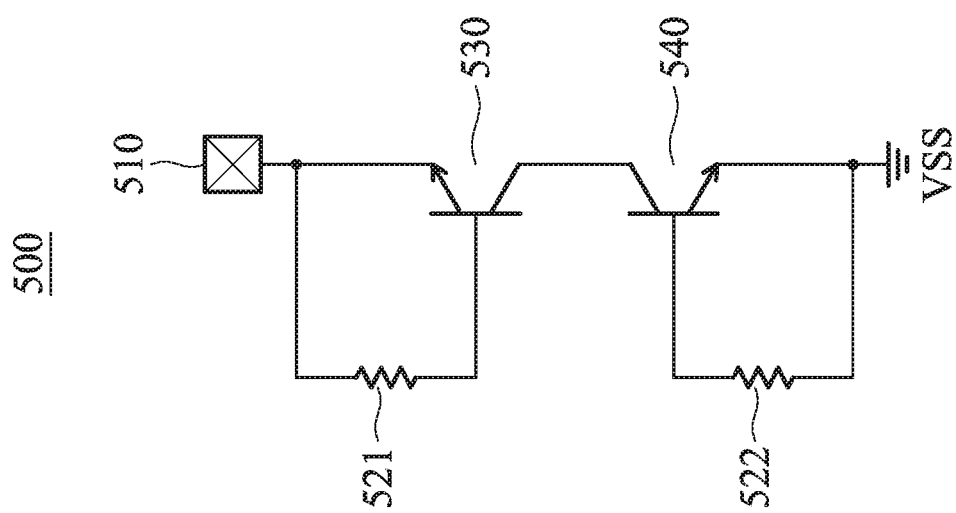
FIG. 5 is a diagram of an ESD protection circuit according to an embodiment of the invention.

FIG. 5 is a diagram of an ESD protection circuit 500 according to an embodiment of the invention. ESD protection circuit 500 includes an input port 510, a first resistor 521, a second resistor 522, a first BJT 530, and a second BJT 540. Input port 510 may be a metal pad, which may be coupled to any terminal point on a chip, such as a terminal of any circuit which needs ESD protection. Resistors 521 and 522 each may be a two-port element or a multi-port element. The resistance of resistors 521 and 522 may be from about 100Ω to about tens of kΩ (or, 100 kΩ). In some embodiments, each of resistors 521 and 522 may be replaced with a variable resistor. BJTs 530 and 540 may be NPN-type. BJT 530 has an emitter, a base, and a collector. The emitter of BJT 530 is coupled to input port 510. The base of BJT 530 is coupled through resistor 521 to input port 510. BJT 540 has an emitter, a base, and a collector. The emitter of BJT 540 is coupled to a supply voltage (e.g., a ground voltage VSS or a power supply voltage VCC). The base of BJT 540 is coupled through resistor 522 to the supply voltage. The collector of BJT 540 is also the collector of BJT 530.

Figure 6:
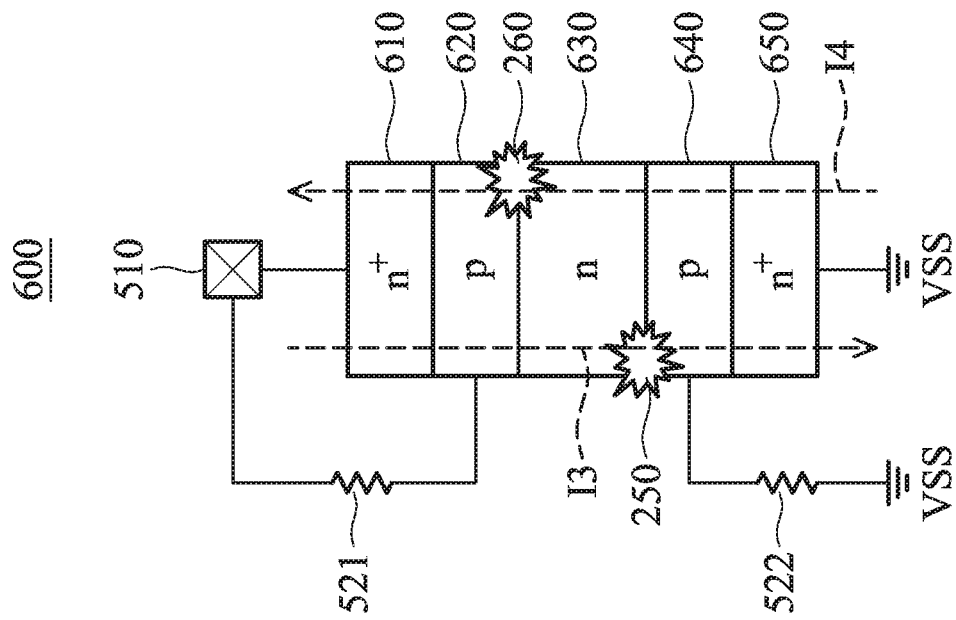
FIG. 6 is a diagram of semiconductor layers of an ESD protection circuit according to an embodiment of the invention.

FIG. 6 is a diagram of semiconductor layers of an ESD protection circuit 600 according to an embodiment of the invention. FIG. 6 is used to describe the operation theory of ESD protection circuit 500 of FIG. 5. Please refer to FIG. 5 and FIG. 6 together. The emitter of BJT 530 is formed by a first type-I semiconductor 610. The base of BJT 530 is formed by a first type-II semiconductor 620. The emitter of BJT 540 is formed by a second type-I semiconductor 650. The base of BJT 540 is formed by a second type-II semiconductor 640. Both the collectors of BJTs 530 and 540 are formed by a third type-I semiconductor 630. Semiconductor 610 is isolated from semiconductor 650. Semiconductor 620 is isolated from semiconductor 640. In the embodiment of FIG. 6, semiconductors 610 and 650 each is a high-doped N-type semiconductor, semiconductors 620 and 640 each is a P-type semiconductor, and semiconductor 630 is a low-doped N-type semiconductor.

The operation theory of ESD protection circuit 600 is as follows. When a positive voltage higher than a first trigger voltage VH3 of ESD protection circuit 600 is applied to input port 510, a PN-junction breakdown occurs between semiconductors 630 and 640 (as breakdown symbol 250). It should be understood that resistor 521 can clamp the junction voltage between semiconductors 610 and 620, thereby preventing a PN-junction breakdown between semiconductors 620 and 610. After a PN-junction breakdown occurs between semiconductors 630 and 640, the breakdown current makes BJT 530 to operate in a reverse active mode and BJT 540 to operate in an active mode, and therefore an input port current I3 flows from input port 510 through semiconductors 610, 620, 630, 640, and 650 to the supply voltage (e.g., the ground voltage VSS). In such a case, the positive electrostatic charges on input port 510 may be removed fast by input port current I3. On the other hand, when a negative voltage lower than a second trigger voltage VH4 of ESD protection circuit 600 is applied to input port 510, a PN-junction breakdown occurs between semiconductors 620 and 630 (as breakdown symbol 260). It should be understood that resistor 522 can clamp the junction voltage between semiconductors 640 and 650, thereby preventing a PN-junction breakdown between semiconductors 640 and 650. After a PN-junction breakdown occurs between semiconductors 620 and 630, the breakdown current makes BJT 530 to operate in an active mode and BJT 540 to operate in a reverse active mode, and therefore an input port current I4 flows from the supply voltage through semiconductors 650, 640, 630, 620, and 610 to input port 510. In such a case, the negative electrostatic charges on input port 510 may be removed fast by input port current I4. The normal voltage operation region of the IC is within the first trigger voltage VH3 and the second trigger voltage VH4, when ESD protection circuits 500 and 600 are not triggered. In other words, ESD protection circuits 500 and 600 can be enabled if the voltage at input port 510 is too high or too low, thereby removing redundant charges on input port 510 and preventing the IC from being damaged. The first trigger voltage VH3 is determined by the PN-junction breakdown voltage between semiconductors 640 and 630. The second trigger voltage VH4 is determined by the PN-junction breakdown voltage between semiconductors 620 and 630. The lower dopant concentration of semiconductors results in a higher breakdown voltage and a wider normal voltage operation region of the IC. In the embodiment, the current gains of BJTs 530 and 540 operating in their active modes are greater than 100, and the current gains of BJTs 530 and 540 operating in their reverse active modes are greater than 1.

Figure 7:
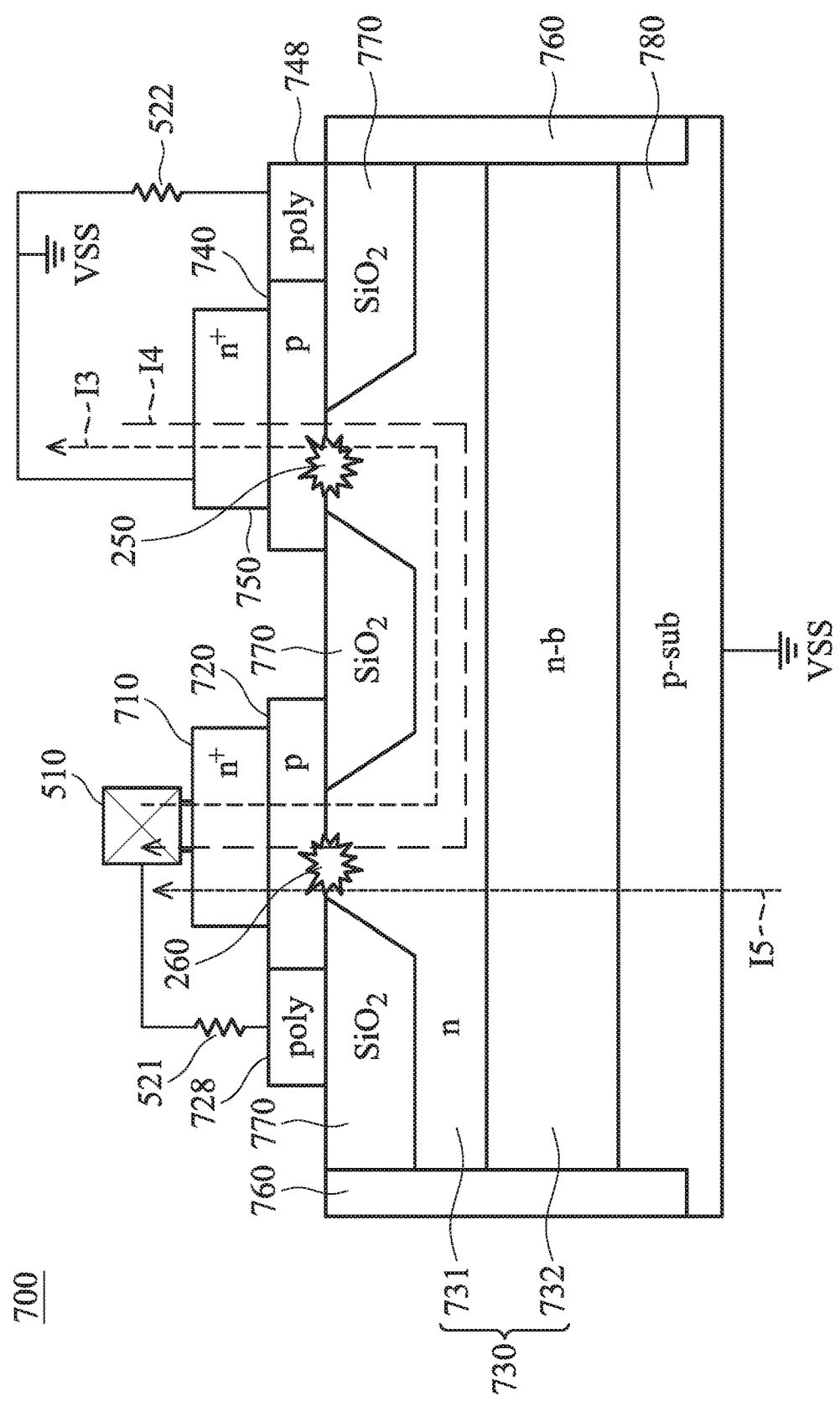
FIG. 7 is a diagram of a sectional semiconductor structure of an ESD protection circuit according to an embodiment of the invention.

FIG. 7 is a diagram of a sectional semiconductor structure of an ESD protection circuit 700 according to an embodiment of the invention. As shown in FIG. 7, ESD protection circuit 700 includes an input port 510, a resistor 521, a resistor 522, a first type-I semiconductor 710, a second type-I semiconductor 750, a first type-II semiconductor 720, a second type-II semiconductor 740, and a third type-I semiconductor 730. Specifically, semiconductor 730 includes a collector layer 731 and a collector buried layer 732. The dopant concentration of collector buried layer 732 is greater than that of collector layer 731. In an embodiment, BJTs 530 and 540 of ESD protection circuit 500 are HBTs, semiconductors 720 and 740 are SiGe layers, resistor 521 is coupled through poly-silicon layer 728 to semiconductor 720, and resistor 522 is coupled through poly-silicon layer 748 to semiconductor 740. Such a embodiment has higher current gain. The difference from the embodiment of FIG. 6 is that ESD protection circuit 700 further includes deep trenches 760, silicon dioxide (SiO2) islands 770, and a type-II semiconductor substrate 780 (e.g., a P-type substrate). Silicon dioxide islands 770 are embedded in collector layer 731 of semiconductor 730, but it does not reach collector buried layer 732 of semiconductor 730. Collector buried layer 732 is positioned between collector layer 731 and substrate 780. Semiconductor 730 is disposed on substrate 780. Substrate 780 is coupled to a supply voltage. In some embodiments, both the dopant concentrations of semiconductors 720 and 740 are much greater than the dopant concentration of substrate 780.

When an aforementioned positive voltage or negative voltage is applied to input port 510, ESD protection circuit 700 can remove redundant charges as follows. When a PN-junction breakdown occurs between semiconductors 730 and 740 due to the aforementioned positive voltage applied to input port 510 (as breakdown symbol 250), an input port current I3 flows from input port 510 through semiconductors 710, 720, 730, 740, and 750 to the supply voltage. On the other hand, when an PN-junction breakdown occurs between semiconductors 720 and 730 due to the aforementioned negative voltage applied to input port 510 (as breakdown symbol 260), an input port current I4 flows from the supply voltage through semiconductors 750, 740, 730, 720, and 710 to input port 510. In some embodiments, substrate 780 is further coupled to the supply voltage (e.g., a ground voltage VSS). When an PN-junction breakdown occurs between semiconductors 730 and 720 due to the aforementioned negative voltage applied to input port 510 (as breakdown symbol 250), an auxiliary current I5 further flows from the supply voltage (e.g., a ground voltage VSS) through substrate 780, semiconductors 730, 720, and 710 to input port 510. Auxiliary current I5 is used to accelerate the discharging of the negative electrostatic charges on input port 510.

Figure 8B:
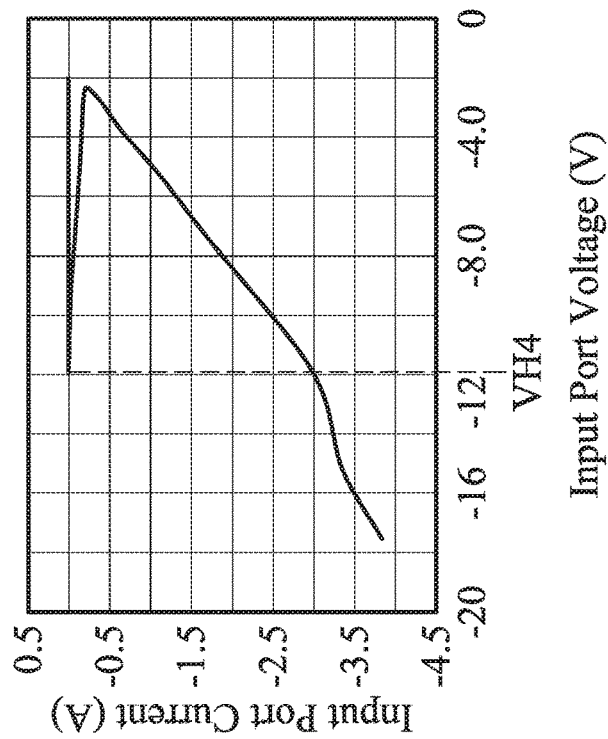
FIGS. 8A and 8B are diagrams of the relationship between input port voltage and input port current of an ESD protection circuit according to an embodiment of the invention.
Figure 8A:
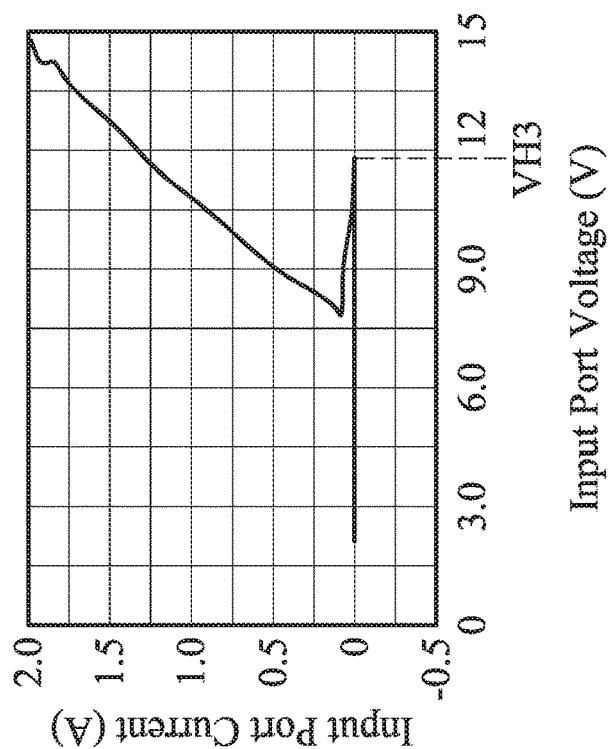

FIG. 8A and FIG. 8B are diagrams of the relationship between the input port voltage and the input port current of ESD protection circuit 700, measured by a TLP generation system, according to an embodiment of the invention. FIG. 8A and FIG. 8B are used to describe the measurement results of ESD protection circuit 700 when positive voltages and negative voltages are applied to input port 510, respectively. As shown in FIG. 8A, if the input port voltage is higher than the first trigger voltage VH3, the magnitude of the input port current will be sharply increased. The breakdown current makes BJT 530 to operate in a reverse active mode and BJT 540 to operate in an active mode, such that a snapback effect appears obviously. Such an effect reduces the voltage-drop of input port voltage and prevents the IC damage. Here, VH3 is the positive breakdown voltage of ESD protection circuit 700, and it is about +12V. As shown in FIG. 8B, if the input port voltage is lower than the second trigger voltage VH4, the magnitude of the input port current will be sharply increased. The breakdown current makes BJT 530 to operate in an active mode and BJT 540 to operate in a reverse active mode, such that a snapback effect appears obviously. Such an effect reduces the voltage-drop of the input port voltage and prevents the IC damage. Meanwhile, auxiliary current I5 further increases the magnitude of the input port current to enhance ESD capability and to reduce the voltage-drop of the input port voltage, further prevent the IC damage. Here, VH4 is the negative breakdown voltage of ESD protection circuit 700, and it is about −12V.

According to the sectional structure of FIG. 7, it is understood that in the invention, the contact area between the emitter and the base of BJTs 530 and 540 of ESD protection circuit 700 is relatively small. The equivalent capacitance of two capacitors in series becomes much smaller, where the capacitors are formed between the emitters and the bases of BJTs 530 and 540. ESD protection circuit 700 of the invention has a relatively small parasitic capacitance, so that the IC can has a larger operation frequency bandwidth. Furthermore, ESD protection circuit 700 is a symmetric structure, as its positive breakdown voltage is substantially equal to its negative breakdown voltage, which can provide a symmetric operation voltage range.

All of the above embodiments use NPN-type BJT(s) to form ESD protection circuits. However, the invention is not limited thereto. The embodiments of FIGS. 9-12 will describe how ESD protection circuits of the invention can be implemented with PNP-type BJT(s), and their operation theory is similar to the above embodiments.

Figure 10:
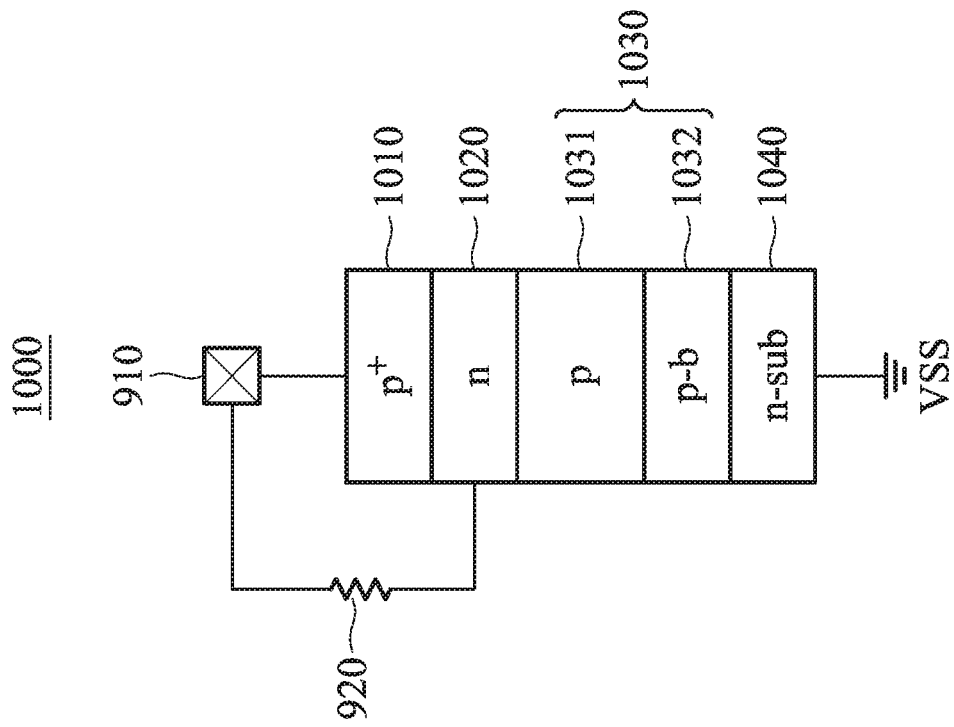
FIG. 10 is a diagram of semiconductor layers of an ESD protection circuit according to an embodiment of the invention.
Figure 9:
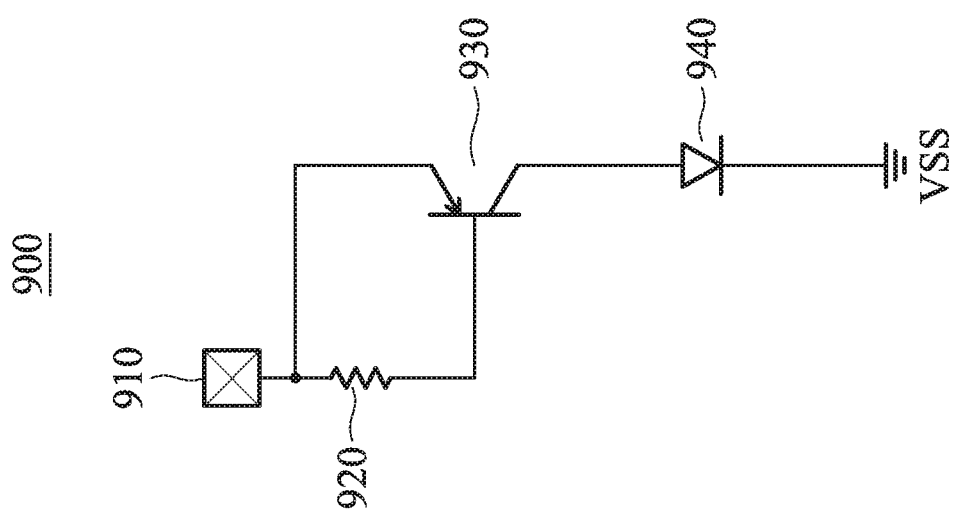
FIG. 9 is a diagram of an ESD protection circuit according to an embodiment of the invention.

FIG. 9 is a diagram of an ESD protection circuit 900 according to an embodiment of the invention. In ESD protection circuit 900, a BJT (PNP-type) 930 has an emitter, a base, and a collector. The emitter of BJT 930 is coupled to an input port 910. The base of BJT 930 is coupled through a resistor 920 to input port 910. A diode 940 has a first terminal (e.g., an anode) and a second terminal (e.g., a cathode). The first terminal of diode 940 is also the collector of BJT 930. The second terminal of diode 940 is coupled to a supply voltage (e.g., a ground voltage VSS). FIG. 10 is a diagram of semiconductor layers of an ESD protection circuit 1000 according to an embodiment of the invention. The emitter of BJT 930 is formed by a first type-I semiconductor 1010. The base of BJT 930 is formed by a first type-II semiconductor 1020. The collector of BJT 930 is formed by a second type-I semiconductor 1030. Diode 940 is formed by semiconductor 1030 and a second type-II semiconductor 1040. In the embodiment of FIG. 10, semiconductor 1010 is a high-doped P-type semiconductor, semiconductor 1020 is an N-type semiconductor, semiconductor 1030 is a low-doped P-type semiconductor, and semiconductor 1040 is an N-type semiconductor substrate.

FIG. 11 is a diagram of an ESD protection circuit 1100 according to an embodiment of the invention. In ESD protection circuit 1100, a first BJT (PNP-type) 1130 has an emitter, a base, and a collector. The emitter of BJT 1130 is coupled to an input port 1110. The base of BJT 1130 is coupled through a first resistor 1121 to input port 1110. A second BJT 1140 (PNP-type) has an emitter, a base, and a collector. The emitter of BJT 1140 is coupled to a supply voltage (e.g., a ground voltage VSS). The base of BJT 1140 is coupled through a second resistor 1122 to the supply voltage. The collector of BJT 1140 is also the collector of BJT 1130. FIG. 12 is a diagram of semiconductor layers of an ESD protection circuit 1200 according to an embodiment of the invention. Refer to FIG. 11 and FIG. 12 together, the emitter of BJT 1130 is formed by a first type-I semiconductor 1210, the base of BJT 1130 is formed by a first type-II semiconductor 1220, the emitter of BJT 1140 is formed by a second type-I semiconductor 1250, and the base of BJT 1140 is formed by a second type-II semiconductor 1240. Both the collectors of BJTs 1130 and BJT 1140 are formed by a third type-I semiconductor 1230. In the embodiment of FIG. 12, semiconductors 1210 and 1250 are high-doped P-type semiconductors, semiconductors 1220 and 1240 are N-type semiconductors, and semiconductor 1230 is a low-doped P-type semiconductor.

These embodiments of the invention propose novel ESD protection circuits, which could provide lower parasitic capacitance, higher breakdown voltage, higher holding voltage, lower cost, or simpler structure. Accordingly, the proposed ESD protection circuits are particularly suitable for applications in high-power RF IC field. These embodiments invention could minimize the probability of the damage of ICs from electrostatic charges, without affecting the original performance of the ICs obviously.

Note that the devices size, devices shape, and devices parameters are not limitations of the invention. A designer can adjust these parameters according to different requirements. The ESD protection circuits of the invention are not limited to the configurations of FIGS. 1-12. The invention may merely include any one or more features of any one or more embodiments of FIGS. 1-12. In other words, not all of the features shown in the figures should be implemented in the ESD protection circuit of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. An ESD protection circuit, comprising:
    an input port;
    a resistor;
    a BJT, having an emitter, a base, and a collector, wherein the emitter of the BJT is coupled to the input port, and the base of the BJT is coupled through the resistor to the input port; and
    a diode, having a first terminal and a second terminal, wherein the first terminal of the diode is the collector of the BJT, and the second terminal of the diode is coupled to a supply voltage;
    wherein the resistor is a two-port element or a multi-port element which has a first terminal coupled to the base of the BJT and a second terminal coupled to the emitter of the BJT;
    wherein when a positive voltage is applied to the input port, the resistor is capable of clamping a junction voltage between the emitter and the base of the BJT.

2. The ESD protection circuit as claimed in claim 1, wherein the emitter of the BJT is formed by a first type-I semiconductor, the base of the BJT is formed by a first type-II semiconductor, the collector of the BJT is formed by a second type-I semiconductor, and the diode is formed by the second type-I semiconductor and a second type-II semiconductor.

3. The ESD protection circuit as claimed in claim 2, wherein:
    the first type-I semiconductor is a high-doped P-type semiconductor, the first type-II semiconductor is an N-type semiconductor, the second type-I semiconductor is a low-doped P-type semiconductor, and the second type-II semiconductor is an N-type semiconductor; or
    the first type-I semiconductor is a high-doped N-type semiconductor, the first type-II semiconductor is a P-type semiconductor, the second type-I semiconductor is a low-doped N-type semiconductor, and the second type-II semiconductor is a P-type semiconductor.

4. The ESD protection circuit as claimed in claim 1, wherein the BJT is a heterojunction bipolar transistor (HBT).

5. The ESD protection circuit as claimed in claim 1, wherein a resistance of the resistor is from about 100Ω to about 100 kΩ.

6. An ESD protection circuit, comprising:
    an input port;
    a first resistor;
    a second resistor;
    a first BJT, having an emitter, a base, and a collector, wherein the emitter of the first BJT is coupled to the input port, and the base of the first BJT is coupled through the first resistor to the input port; and
    a second BJT, having an emitter, a base, and a collector, wherein the emitter of the second BJT is coupled to a supply voltage, the base of the second BJT is coupled through the second resistor to the supply voltage, and the collector of the second BJT is the collector of the first BJT;
    wherein when a positive voltage is applied to the input port, the first resistor is capable of clamping a junction voltage between the emitter and the base of the first BJT;
    wherein when a negative voltage is applied to the input port, the second resistor is capable of clamping a junction voltage between the emitter and the base of the second BJT.

7. The ESD protection circuit as claimed in claim 6, wherein the emitter of the first BJT is formed by a first type-I semiconductor, the base of the first BJT is formed by a first type-II semiconductor, the emitter of the second BJT is formed by a second type-I semiconductor, the base of the second BJT is formed by a second type-II semiconductor, and both the collector of the first BJT and the collector of the second BJT are formed by a third type-I semiconductor.

8. The ESD protection circuit as claimed in claim 7, wherein:
    the first type-I semiconductor and the second type-I semiconductor are each a high-doped N-type semiconductor, the first type-II semiconductor and the second type-II semiconductor are each a P-type semiconductor, and the third type-I semiconductor is a low-doped N-type semiconductor; or
    the first type-I semiconductor and the second type-I semiconductor are each a high-doped P-type semiconductor, the first type-II semiconductor and the second type-II semiconductor are each an N-type semiconductor, and the third type-I semiconductor is a low-doped P-type semiconductor.

9. The ESD protection circuit as claimed in claim 7, wherein the ESD protection circuit further comprises a type-II semiconductor substrate, the third type-I semiconductor is disposed on the type-II semiconductor substrate, and the type-II semiconductor substrate is coupled to the supply voltage.

10. The ESD protection circuit as claimed in claim 6, wherein each BJT is a heterojunction bipolar transistor (HBT).

11. The ESD protection circuit as claimed in claim 6, wherein each resistor is a two-port element or a multi-port element.

12. The ESD protection circuit as claimed in claim 6, wherein a resistance of each resistor is from about 100Ω to about 100 kΩ.

13. An ESD protection circuit, comprising:
    an input port;
    a resistor;
    a BJT, having an emitter, a base, and a collector, wherein the emitter of the BJT is coupled to the input port, and the base of the BJT is coupled through the resistor to the input port; and
    a diode, having a first terminal and a second terminal, wherein the first terminal of the diode is the collector of the BJT, and the second terminal of the diode is coupled to a supply voltage;
    wherein the emitter of the BJT is formed by a first type-I semiconductor, the base of the BJT is formed by a first type-II semiconductor, the collector of the BJT is formed by a second type-I semiconductor, and the diode is formed by the second type-I semiconductor and a second type-II semiconductor;
    wherein:

the first type-I semiconductor is a high-doped P-type semiconductor, the first type-II semiconductor is an N-type semiconductor, the second type-I semiconductor is a low-doped P-type semiconductor, and the second type-II semiconductor is an N-type semiconductor; or the first type-I semiconductor is a high-doped N-type semiconductor, the first type-II semiconductor is a P-type semiconductor, the second type-I semiconductor is a low-doped N-type semiconductor, and the second type-II semiconductor is a P-type semiconductor.

* * * * *